(12) United States Patent
Purser et al.

(10) Patent No.: US 7,351,984 B2
(45) Date of Patent: Apr. 1, 2008

(54) CONTROLLING THE CHARACTERISTICS OF IMPLANTER ION-BEAMS

(75) Inventors: Kenneth H. Purser, Lexington, MA (US); Harald A. Enge, Sherborn, MA (US); Norman L. Turner, Vero Beach, FL (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/784,073

(22) Filed: Apr. 5, 2007

(65) Prior Publication Data

US 2007/0181832 A1 Aug. 9, 2007

Related U.S. Application Data

(60) Division of application No. 11/154,085, filed on Jun. 16, 2005, which is a continuation of application No. 10/619,702, filed on Jul. 15, 2003, now Pat. No. 6,933,507.

(60) Provisional application No. 60/396,322, filed on Jul. 17, 2002.

(51) Int. Cl.
*H01J 21/425* (2006.01)
(52) U.S. Cl. .................. 250/396 ML; 250/492.21; 250/492.23; 250/492.3; 250/396 R
(58) Field of Classification Search ........... 250/492.21, 250/396 ML
See application file for complete search history.

(56) References Cited

U.S. PATENT DOCUMENTS 3,541,328 A 11/1970 Enge .................. 250/41.9

(Continued)

FOREIGN PATENT DOCUMENTS

JP 07-071947 3/1995

(Continued)

OTHER PUBLICATIONS

Nuclear Instruments and Methods in Physics Research A258 (1987) pp. 437-442; Nicholas R. White et al.; "The Design of Magnets with Nondipole Field Components".

(Continued)

*Primary Examiner*—Nikita Wells
*Assistant Examiner*—James J Leybourne
(74) *Attorney, Agent, or Firm*—Nields & Lemack

(57) ABSTRACT

A method and apparatus satisfying growing demands for improving the precision of angle of incidence of implanting ions that impact a semiconductor wafer and the precision of ribbon ion beams for uniform doping of wafers as they pass under an ion beam. The method and apparatus are directed to the design and combination together of novel magnetic ion-optical transport elements for implantation purposes. The design of the optical elements makes possible: (1) Broad-range adjustment of the width of a ribbon beam at the work piece; (2) Correction of inaccuracies in the intensity distribution across the width of a ribbon beam; (3) Independent steering about both X and Y axes; (4) Angle of incidence correction at the work piece; and (5) Approximate compensation for the beam expansion effects arising from space charge. In a practical situation, combinations of the elements allow ribbon beam expansion between source and work piece to 350 millimeter, with good uniformity and angular accuracy. Also, the method and apparatus may be used for introducing quadrupole fields along a beam line.

11 Claims, 16 Drawing Sheets

U.S. PATENT DOCUMENTS

| | | | |
|---|---|---|---|
| 5,350,926 A | 9/1994 | White et al. | 250/492.21 |
| 5,422,723 A | 6/1995 | Paranjpe et al. | |
| 5,834,786 A | 11/1998 | White et al. | 250/492.21 |
| 6,160,262 A | 12/2000 | Aoki et al. | 250/492.21 |
| 6,933,507 B2 * | 8/2005 | Purser et al. | 250/396 ML |
| 2004/0263846 A1 | 12/2004 | Kwan | |

FOREIGN PATENT DOCUMENTS

| | | |
|---|---|---|
| JP | 2004-251682 | 9/2004 |

OTHER PUBLICATIONS

Nuclear Instruments and Methods (36 91976) pp. 213-224; H.J. Scheerer et al.; "The Multipole Element of the Q3D Spectrograph for Correction of the Kinematic Broadening".

The Review of Scientific Instruments, vol. 30, No. 10; L.N. Hand et al.; "Magnetic Quadrupole with Rectangular Aperture".

* cited by examiner

CONTROLLING THE CHARACTERISTICS OF IMPLANTER ION-BEAMS

CROSS REFERENCE AND RELATIONSHIP

This application is a Divisional of U.S. Ser. No. 11/154,085 filed Jun. 16, 2005, which is a Continuation of U.S. Ser. No. 10/619,702 filed Jul. 15, 2003, now U.S. Pat. No. 6,933,507, which claims priority to U.S. provisional patent application Ser. No. 60/396,322 filed Jul. 17, 2002, the disclosures of which are incorporated herein by reference.

FIELD OF INVENTION

The disclosed methods and apparatus relate generally to the construction and use of magnetic focusing and correction elements for modifying the intensity distribution of ions within ribbon beams and more particularly to precision correction of the angle of incidence of ions used for implanting and doping in semiconductor devices.

BACKGROUND TO THE INVENTION

The process of ion implantation is useful in semiconductor manufacturing as it makes possible the modification of the electrical properties of well-defined regions of a silicon wafer by introducing selected impurity atoms, one by one, at a velocity such that they penetrate the surface layers and come to rest at a specified depth below the surface. It makes possible the creation of three-dimensional electrical circuits and switches with great precision and reproducibility.

The characteristics that make implantation such a useful processing procedure are threefold: First, the concentration of introduced dopant atoms can be accurately measured by straight-forward determination of the incoming electrical charge that has been delivered by charged ions striking the wafer. Secondly, the regions where the above dopant atoms are inserted can be precisely defined by photo resist masks that make possible precision dopant patterning at ambient temperatures. Finally, the depth at which the dopant atoms come to rest can be adjusted by varying the ion energy, making possible the fabrication of layered structures. Systems and methods are desired for enhancing the ion implantation process.

The ion species presently used for silicon implantation include arsenic, phosphorus, germanium, boron and hydrogen having energies that range from below 1 keV to above 80 keV. Ion currents ranging from microamperes to multi-milliamperes are needed. Tools providing implant currents greater than ~5 mA are commonly referred to as 'high-current' implanters. Trends within the semiconductor industry are moving towards implantation energies below 1 keV and control of angle of incidence below 1°.

Typically, an ion implanter for introducing such dopant materials into silicon wafers and other work pieces may be modeled into four major systems: First, an ion source where the charged ions to be implanted are produced. Secondly, an acceleration region where the energy of the ions is increased to that needed for a specified implant procedure. Thirdly, an optical ion transport system where the ion ensemble leaving the source is shaped to produce the desired implant density pattern and where unwanted particles are eliminated. Finally, an implant station where individual wafers are mounted on the surface of an electrostatic chuck or a rotating disc that is scanned through the incoming ion beam and where a robot loads and unloads wafers. One aspect of the present invention aims towards enhancing or improving ion beam transport systems.

A recent improvement for ion implanter design has been the introduction of ribbon beam technology. Here, ions arriving at a work piece are organized into a stripe that coats the work piece uniformly as it is passed under the ion beam. The cost advantages of using such ribbon beam technology are significant: For disc-type implanters, ribbon-beam technology eliminates the necessity for scanning motion of the disc across the ion beam. For single-wafer implanters the wafer need only be moved under the incoming ribbon beam along a single dimension, greatly simplifying the mechanical design of end-stations and eliminating the need for transverse electromagnetic scanning. Using a correctly shaped ribbon beam, uniform dosing density is possible across a work piece with a single one-dimensional pass.

The technical challenges of generating and handling ribbon beams are non trivial because the ribbon beam/end station arrangement must produce dose uniformities better than 1%, angular accuracies better than 1 degree and operate with ion energies below 1 keV. U.S. Pat. No. 5,350,926 entitled "High current ribbon beam ion implanter" and U.S. Pat. No. 5,834,786, entitled "Compact high current broad beam ion implanter", both issued to White et al., present some features of ribbon beam technology.

White et al. have also reviewed some of the problems of generating ribbon beams in an article entitled "The Control of Uniformity in Parallel Ribbon Ion Beams up to 24 Inches in Size" presented on page 830 of the 1999 Conference Proceedings of Applications of Accelerators in Research and Industry", edited by J. L. Dugan and L Morgan and published by the American Institute of Physics (1-56396-825-8/99).

By its very nature, a ribbon beam has a large width/height aspect ratio. Thus, to efficiently encompass such a beam traveling along the Z-axis, a focusing lens for such a beam must have a slot-like characteristic with its slot extending along the X-axis and its short dimension across the height of the ribbon (the Y-direction). The importance of this is that, while the focal lengths of a magnetic quadrupole lens in each dimension are equal but of opposite sign, the angular deflections of the ribbon's boundary rays in the width and height dimensions can be very different. In addition, the magnetic field boundaries of the lens can be close to the ion beam permitting local perturbations introduced along these boundaries to have deflection consequences that are effectively limited to a small region of the ribbon beam.

SUMMARY

While in principle it is feasible to generate a wanted shape of ribbon beam directly from an ion source, in a practical situation full-length ribbon extraction may not be feasible. Often it is desirable to generate a modest-length ribbon at the source and expand it to the width required for implantation, using ion-optical expansion. Another aspect of the present invention is directed towards extracting ions from an ion source in the form of a multiplicity of individual beamlets whose central trajectories are parallel and arranged in a linear manner. Such geometry provides a precise definition of the origin and angular properties for each beamlet. Those skilled in the art will recognize that these principles remain valid even if multiple parallel rows of beamlets are used or if the central trajectories of the beamlets are not parallel when they leave the source region or if a slit-geometry is chosen for ion extraction.

Furthermore, those skilled in the art will recognize that focusing and deflection elements will be needed to transport the ions between an ion source and a work piece where the particles are to be implanted. For focusing lenses to operate as ideal focusing elements it is desirable that, to first order, the angular deflection introduced to the trajectory of individual beamlets be proportional to the beamlets distance from the lens symmetry axis; namely, the magnitude of the deflecting fields should increase linearly with distance from the central trajectory of the ion beam.

Quadrupole lenses satisfying the linearity requirement described above and having high length to height aspect ratio have been described by W. K. Panofsky et al. in the journal Review of Scientific Instruments volume 30, 927, (1959), for instance. Basically, their design consists of a rectangular high permeability steel frame with each of the long sides of the frame supporting a single uniformly wound coil. To generate a quadrupole field the top and bottom coils are wound equally spaced along each of the long sides of the steel frame members with the currents through the coils being excited in opposite directions when viewed from one end of the rectangular array. A north pole at the end of one bar sees a south pole facing it. On the short sides of the rectangular frame, additional coils are used to buck the magnetostatic potential at both ends of each long side preventing magnetic short circuits through the end-bars. For quadrupole field generation the opposing ampere-turns along each vertical bar are equal to the ampere-turns along each of the long bars. The currents passing through these two bucking coils will be equal but generate fields in opposing directions.

For many focusing applications the correction of aberrations and the compensation of non-linear spreading of a low energy beam is critical so that the possibility for producing deviations from a linear growth of magnetic field away from the center is desirable. A method for introducing the necessary multipole components to the field has been described by Enge '328 in U.S. Pat. No. 3,541,328, particularly, the method described in this document for producing multipole focusing fields in the space between two iron cores between which ions are passed. A series of independently excitable windings, each having a coil distribution appropriate for generating a specific multipole, are wound along each of the iron cores. In the journal Nuclear Instruments and Methods, volume 136, 1976, p 213-224 H. J. Scheerer describes the focusing characteristics of such a dual rod design in accordance with the description in U.S. Pat. No. 3,541,328. Specifically, in FIG. 6 of this patent it can be seen the coils for each multipole are connected in series and powered as a single unit.

The Panofsky quadrupoles and Enge multipole generators were both conceived for transmitting ions through a beam transport system where the parameters of the ion transport elements are fixed for a single experiment or measurement. They suffer disadvantages when active control of the deflecting fields is needed to correct beam parameters. First, neither design generates a dipole field contribution where the B-field is along the long axis of the rectangle. Secondly, the symmetry point (x=0) is usually established from the geometry of the coils and of the steel yokes so there is no easy way to introduce steering about the y-axis by moving the center of the lens-field distribution.

In an embodiment of the present invention, a rectangular steel window frame construction provides the magnetic supporting structure needed for producing the wanted deflection fields. A feature of the present embodiment is that the windings along the long-axis bars consist of a large number of independently excited short sections. This concept allows high-order multipoles to be generated without dedicated windings and the central point of any multipole contribution can be translated along the transverse x-axis. Additional coils around the end bars are essential for eliminating magnetic short circuits when multipole components are being generated. However, these end-bar coils can also be excited independently in a manner that allows the production of a pure dipole field between the long-axis bars at right angles to the long dimension of the rectangle. Finally, when the coils on the end bars are switched off, dipole fields can be generated along the long axis of the window frame.

In another embodiment of the present invention, local variations in ion density or the shape of the ribbon beam at the exit from the source are corrected by locally modifying the deflecting fields. These corrections can be made under computer control and on a time scale that is only limited by the decay rate of eddy currents in the steel. The input beam parameters needed for control involves position-sensitive faraday cups for measuring the intensity and angle distribution of ions within said ribbon beam allowing discrepancies from the wanted distribution to be corrected by modifying the deflection fields.

While each of the applications of such lens variations will be discussed further, it should be appreciated that, because of linear superposition of fields in free space, the currents necessary to produce a particular type of correction can be calculated individually. This process can be repeated for each type of correction needed with the complete solution being produced by superposition. Such concurrent introduction of a selected group of multipole fields into a single beam transport element has been described by White et al. in the journal Nuclear Instruments and Methods volume A 258, (1987) pp. 437-442 entitled "The design of magnets with non-dipole field components".

The fundamental concept underlying the present invention is the creation of a region filled with magnetic fields that encompasses all trajectories comprising a ribbon beam. The d.c. magnetic fields having a magnitude and direction throughout the region that is appropriate to introduce the wanted deflections of all beamlets constituting the ribbon beam. Within the constraints implied by Maxwell's equations, magnetic field configurations can be chosen that provide controlled changes in the angular coordinates of beamlets and produce superposed corrections for: (1) angular errors, (2) differential intensity errors, (3) uniform steering about axes normal to both ($y_0$, $z_0$) and ($x_0$, $z_0$) planes, (4) the introduction of linear positive and negative focusing, (5) specialized deflection fields for aberration correction.

Other objects and advantages will become apparent herinafter in view of the specifications and drawings.

BRIEF DESCRIPTION OF THE DRAWINGS

For better understanding of the present invention, reference is made to the accompanying drawings, which are incorporated herein by reference

DETAILED DESCRIPTION

The unique properties of the system according to the present invention will be better elucidated by reference to a practical example. In this example, a pair of quadrupole lenses are used to expand an initially parallel set of beamlets to a broader set of parallel beamlet trajectories.

Figure 1:
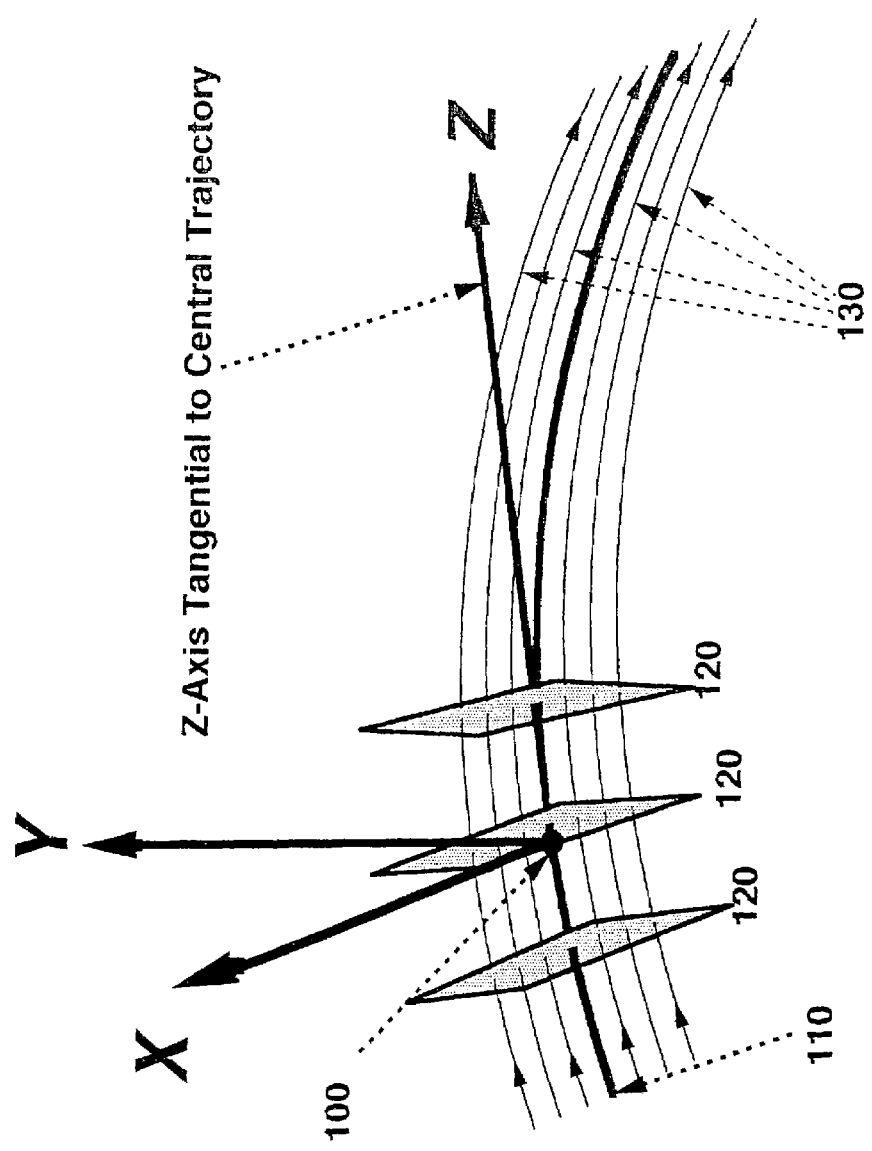
FIG. 1 illustrates a beam coordinate system used in connection with an embodiment of the present invention.

FIG. 1 illustrates the beam coordinate system used in the following discussions. Three representative sections, 120, across a ribbon beam are shown. The X-axis is always aligned with the surfaces, 120, at right angles to the beamlets, 130, comprising the ribbon beam and along the surface's long axis. The Z-axis, 110, is tangential to the central trajectory, of the ribbon beam and remains coincident with the central trajectory throughout the length of the ion optical transport system, causing it to change direction as the central trajectory, 110, changes direction. At each point along the beam path the Cartesian Y-axis lies also in the surface, 120, and along the ribbon beam's cross-sectional narrow dimension.

Figure 2:
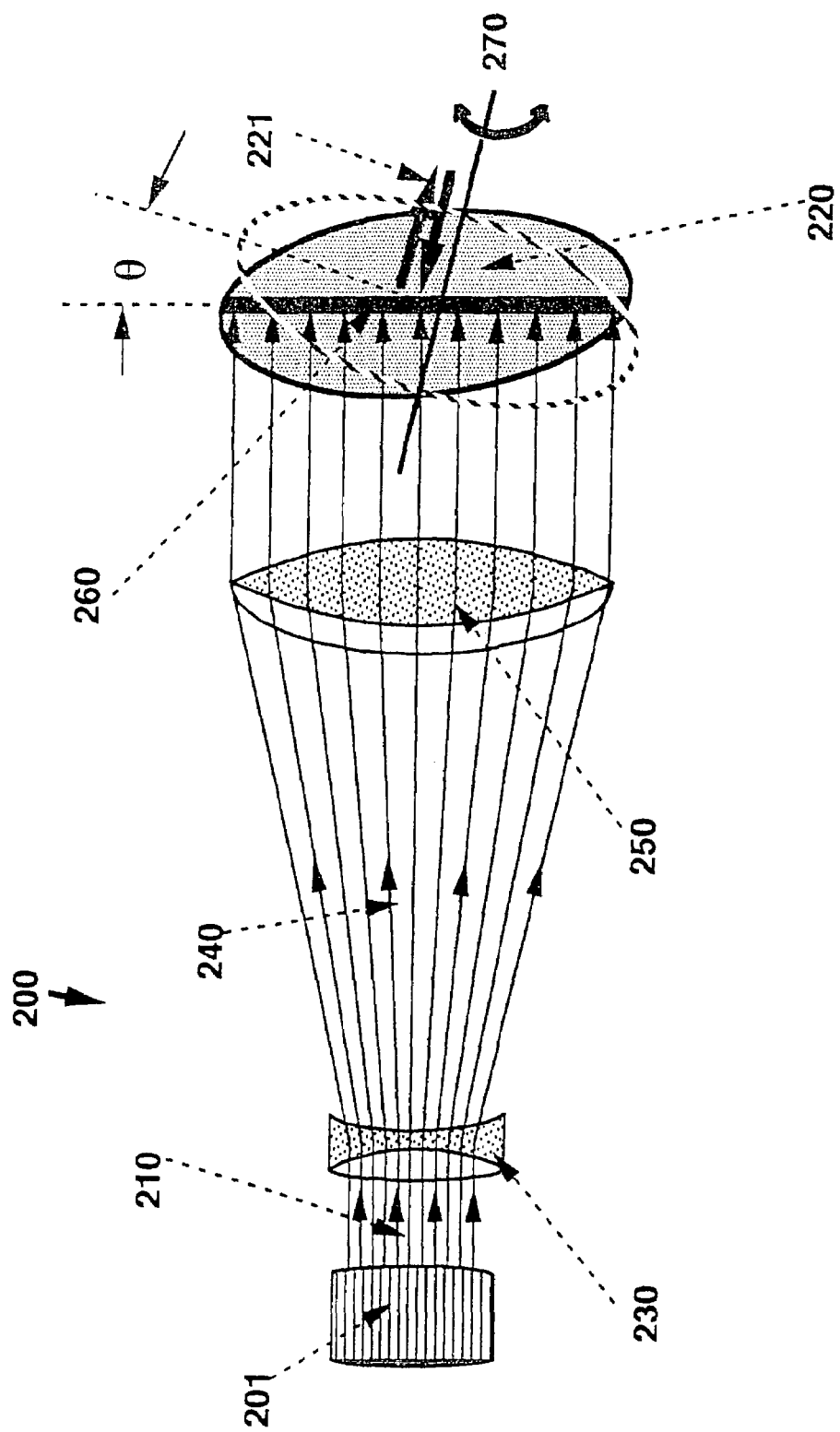
FIG. 2 illustrates expansion optics for an optical expander used in connection with an embodiment of the present invention.

FIG. 2 shows the essential structure of an ion beam expander, 200, that optically couples an ion source, 201, having narrow width, to produce a ribbon height at a work piece or wafer, 220, that allows simultaneous ribbon beam implantation across the whole wafer width in a single traverse of the wafer 220, using linear reciprocating motion, 221. A short ribbon beam generated by the ion source 201, in the form a group of beamlets arranged in a linear array, 210, is expanded so that its width at a converging lens, 250, matches that needed at a work piece, 220, being implanted. The beam expander, 200, further comprises a diverging lens, 230, followed by a free-space drift region, 240, where the individual ion beamlets drift apart before they are collimated back to parallelism by the larger width converging lens, 250.

In the preferred embodiment the work piece, 220, passes under an expanded ribbon beam pattern, 260, at constant velocity with the angle of incidence being adjustable by rotating the wafer about an axis, 270, to modify the ion impact angle, $\theta$. When the wafer is rotated about the axis, 270, to large angles, the beam width can be adjusted by modifying the expansion ratio to minimize beam wastage. For the geometry of FIG. 2 the ion density should be constant across the width of the ribbon beam. However, for geometries such as those of a rotating disc type implanter, the ion density within the ribbon beam must vary with implant radius. In this case, it will be clear that to produce doping uniformity at the work piece the ribbon beam ion density will generally require active correction across the ribbon beam.

Figure 3:
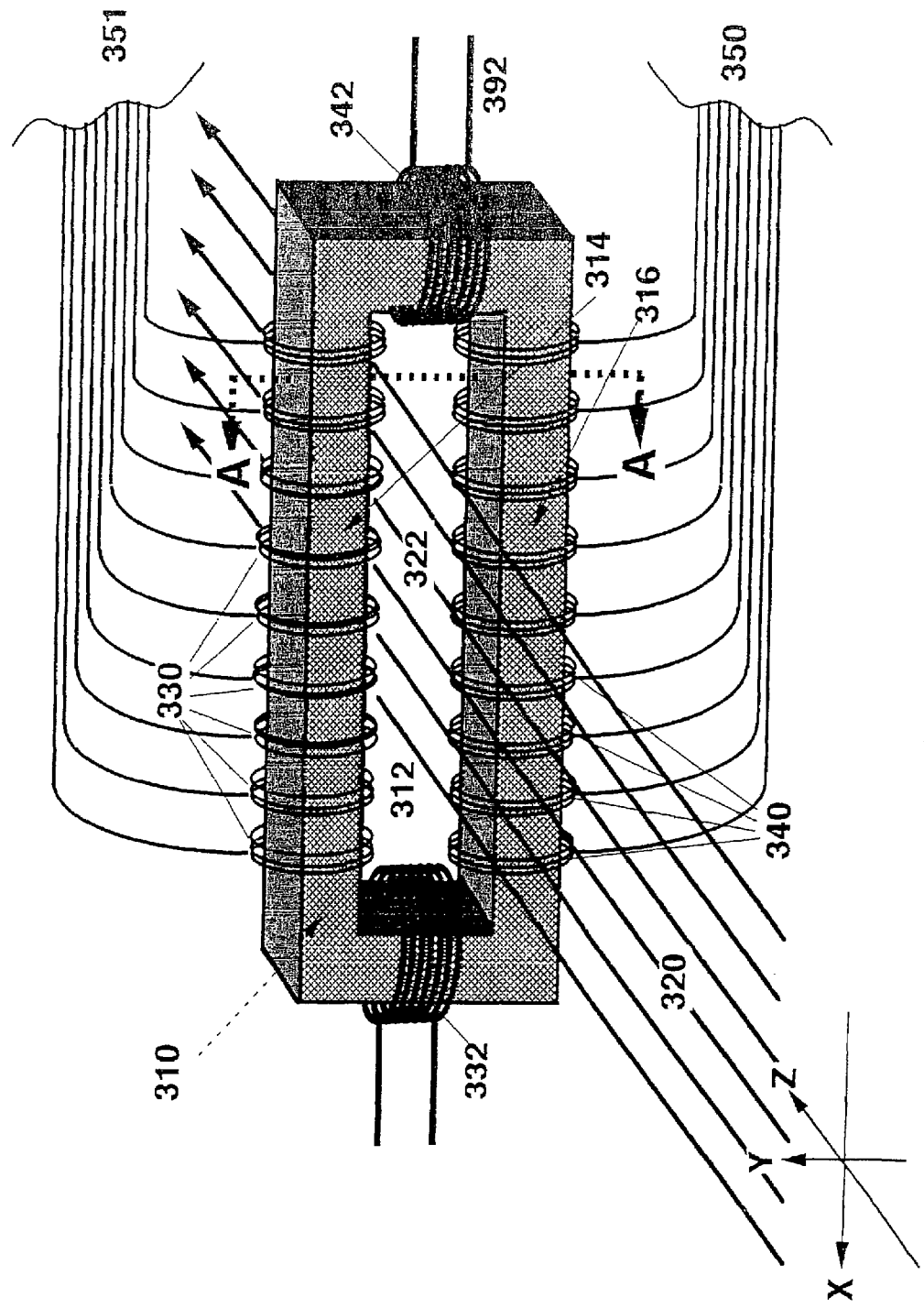
FIG. 3 illustrates the geometry of a lens corrector according to an embodiment of the present invention.

FIG. 3 shows the basic features of lens correctors according to the embodiment of the present invention. A high-permeability rectangular steel structure, 310, aligned with its long axis parallel to the width of a ribbon beam, 320, (X-coordinate) and with its geometric center coincident with the geometric center of the ribbon beam, supports coils, 330, 340, that are used to generate the wanted magnetic fields within a gap, 312, through which the ions forming the ribbon beam, 320, are directed. Individual coils, 330, 340, shown schematically, are distributed along both long-axis bars, 314, 316, of the rectangular steel structure, 310, with individual controllable power supplies establishing the current through each of the coils via the circuits, 350 and 351. While, for clarity, the individual coils, listed as 330 and 340, are shown with considerable separation, in practice the coils should be as close together as is practical to allow the magnetic field on the axis of beam region, 322, to vary smoothly. For some applications where the coils, 330, and 340, must have large cross section to minimize power dissipation, thin ferromagnetic plates (not shown) can be used to separate individual coils and relay the scalar potentials nearer to the ion beam boundaries. Alternatively, the coils 330 and 340 may be connected together as a continuous coil.

End coils, 332 and 342, shown in FIG. 3, are not necessarily divided into multiple elements. Their primary function is to establish appropriate magnetostatic potentials that prevent magnetic short circuits between the upper and lower steel bars, 314, and 316. During quadrupole operation equal and opposite ampere-turns must be generated by coils, 332 and 342, to the ampere turns applied along the long axes of the rectangular structure. To make possible the production of several deflection modes the current directed through the end coils, 332 and 342, should be reversible and adjustable with precision. During the generation of dipole magnetic fields along the X-axis, coils 332 and 342, may be turned off.

Figure 4:
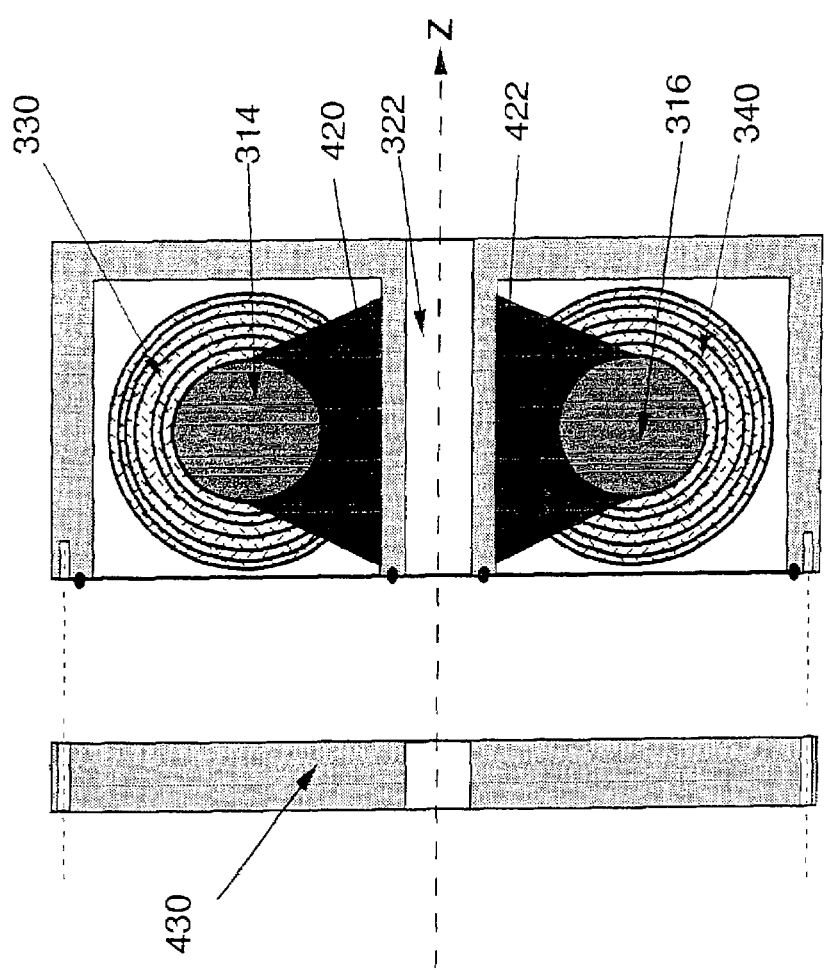
FIG. 4 illustrates a cross sectional view of FIG. 3 in the x-direction showing how magnetostatic potential transfer plates transfer potential to the region of the ribbon beam according to an embodiment of the present invention.

FIG. 4, illustrates a cross-section as viewed along the line A-A', in the x-direction, shown in FIG. 3 with the addition of a surrounding vacuum enclosure. It can be seen that small high permeability steel tabs, 420 and 422, mentioned earlier, transfer the magnetostatic potential generated along each bar, 314 and 316, to the boundaries of the ion beam region, 322. The straight section of the steel tabs, 420 and 422, should be located as close as possible to the ion beam to localize the position resolution of correcting field components.

Figure 5:
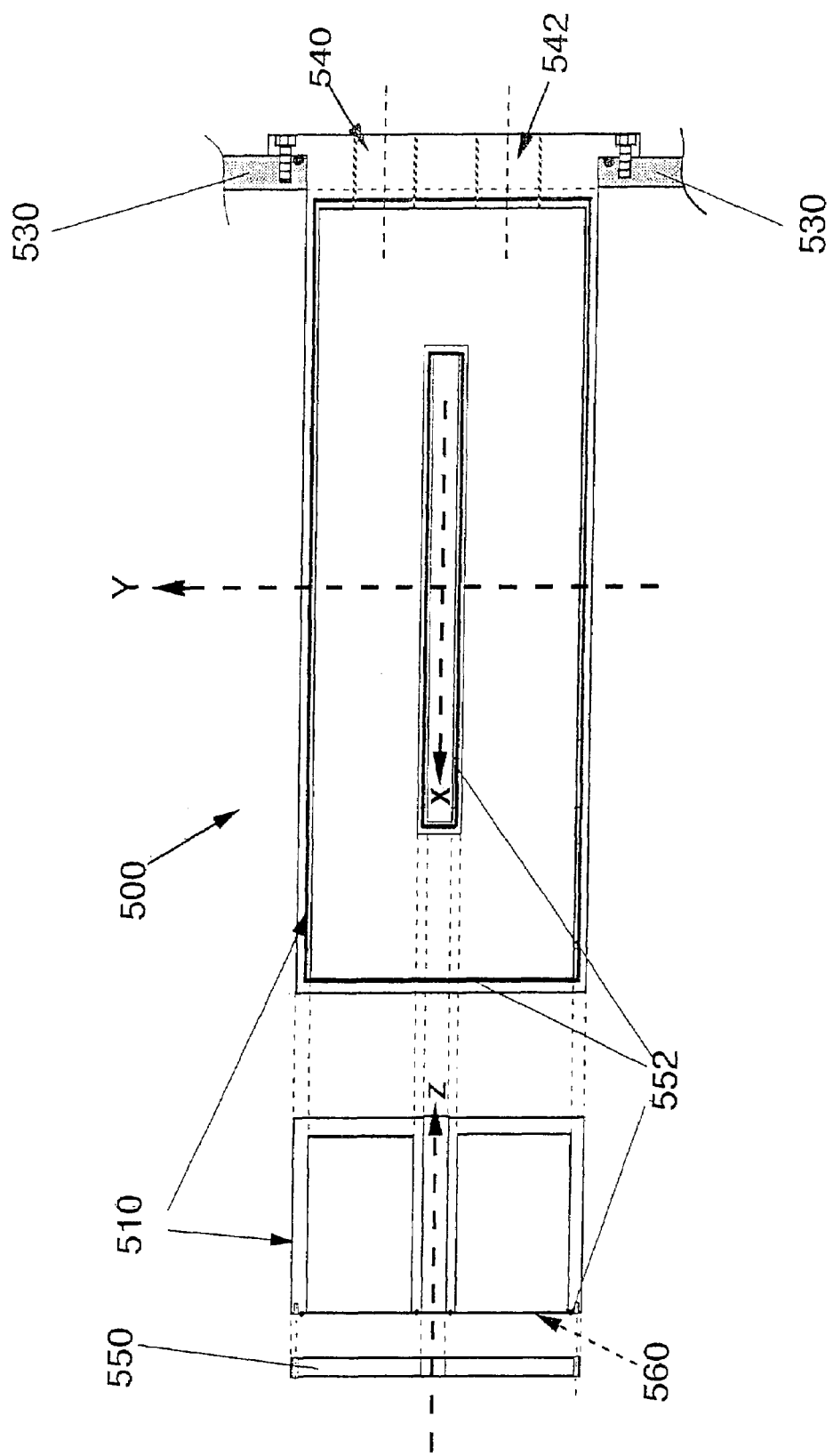
FIG. 5 Illustrates an enclosure for a lens corrector according to an embodiment of the present invention.

Without reservations, the projections shown in FIG. 5 show the preferred embodiment of a lens-corrector enclosure. The design goal for the enclosure is to avoid exposure of the vacuum environment to the coils and their insulation. Also, to avoid vacuum to air feed-throughs for power feed and water-cooling channels. Basically, a magnetic lens/corrector can operate at ambient atmospheric pressure inside such an enclosure, 510. It has vacuum on the outside, 500, and ambient atmospheric pressure or liquid cooling on the inside, 510. The enclosure must have a depth along the Z-axis adequate to contain a coil structure as described in FIGS. 3 and 4 and sufficient magnetic path length along the ion beam that the ions can be deflected through the wanted correction angle. While those skilled in the art will recognize that there are many methods of fabricating the enclosure, 510, in the present embodiment the enclosure is machined from a suitable block of aluminum jig-plate. During operation the enclosure, 510, is bolted to a housing that is part of an implantation system's vacuum envelope, 530. Such a construction serves to define the position of the corrector element with respect to other optical elements that are part of the beam transport components used in an implanter. The corrector lens shown in FIG. 3 or 4 may be connected to the ambient atmosphere via connecting holes, 540 and 542. Through these holes, 540 and 542, pass electric power leads for each of the coils plus air or liquid cooling for the coils. The enclosure, 510, is made vacuum tight by attaching a simple plate, 550, to the flat surface, 560, sealed with O-rings, 552.

Figure 6:
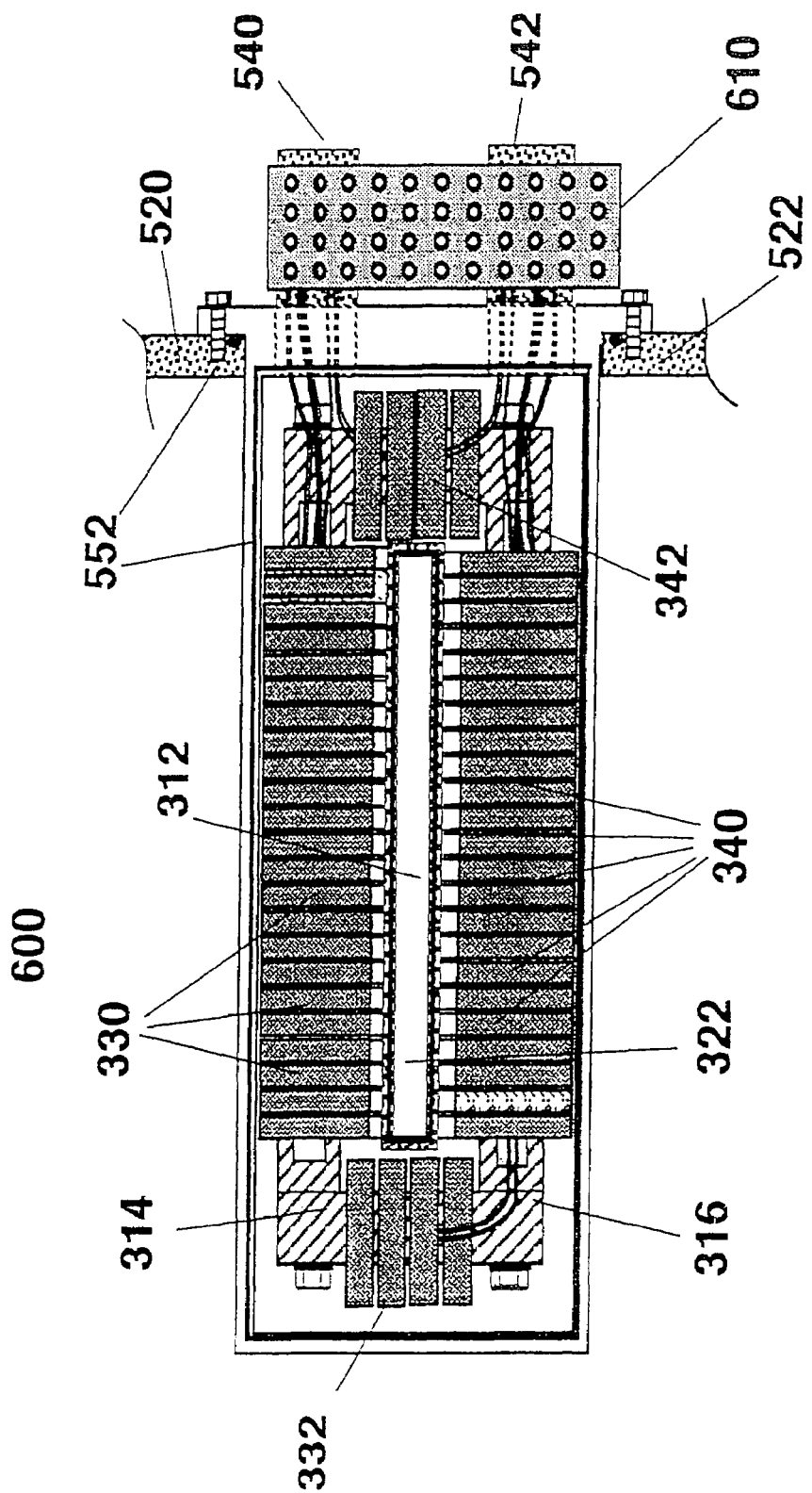
FIG. 6 Illustrates a focusing lens and corrector assembly according to an embodiment of the present invention.

The cross section view of FIG. 6 illustrates an assembled structure of a typical lens-corrector, 600, where like elements are described in previous embodiments. The rectangular high permeability bar structure, 314 and 316, is the basis of the rectangular window frame. It will be seen that for ease of wiring and cooling the steel bars may be fabricated from appropriate steel tubing that will allow easy access for the wiring and cooling lines. The Z-axis of the ribbon beam plane passes through the open center, 322, of the corrector. Power and cooling are introduced through the penetrations, 542. The electrical connections are arranged using the distribution panel, 610.

Figure 7:
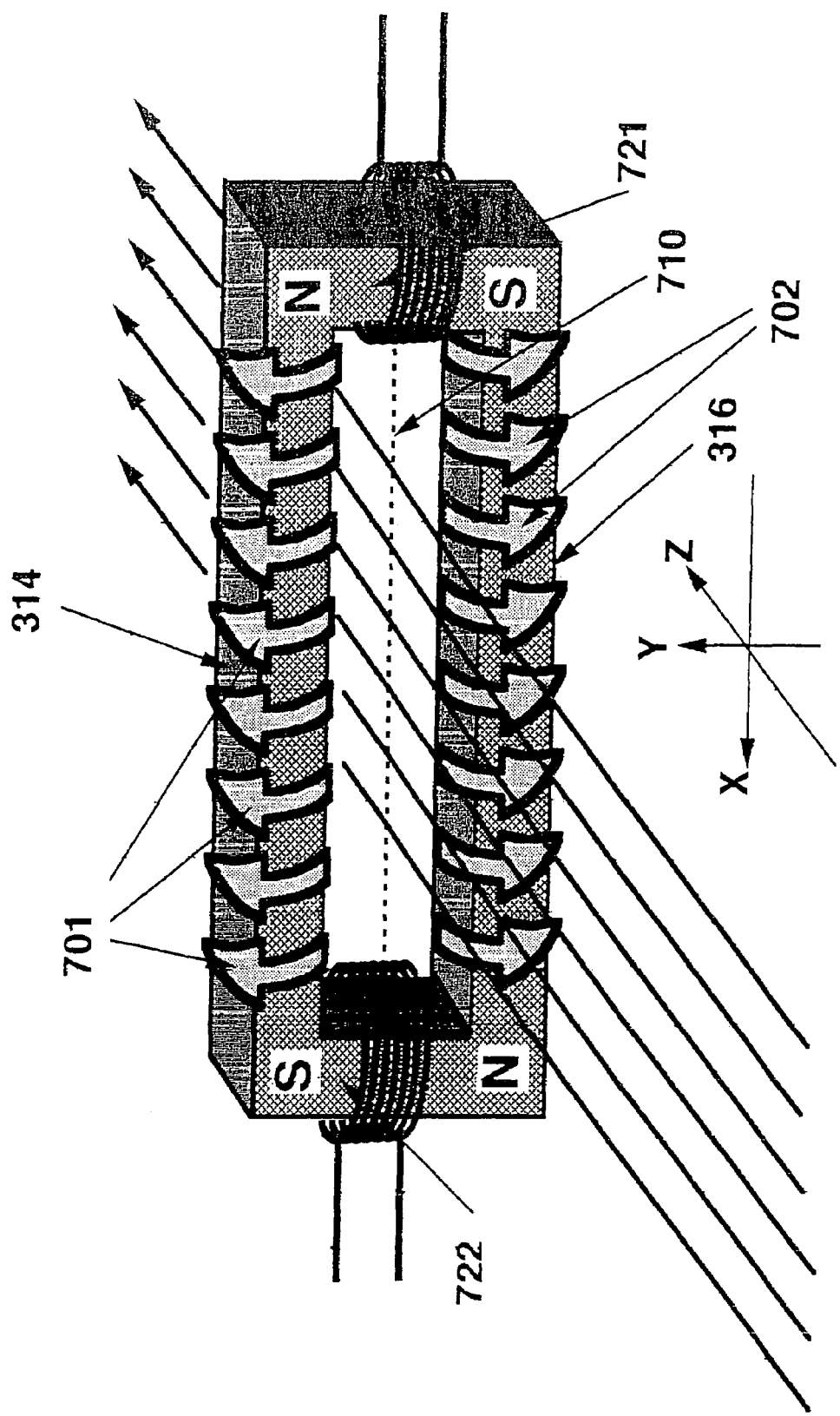
FIG. 7 illustrates quadrupole operation according to an embodiment of the present invention.

FIG. 7 illustrates the background to the generation of a quadrupole field in the region between rectangular bars, 314 and 316, and how such a distribution can be modified to correct for aberrations. Assuming that a uniform current sheet, $j_z(x)$, 701, 702, is produced as illustrated by the modules around the surface of each bar, these current sheets will generates a magnetic field, $B_x(x)$, in the immediate surface of the winding given by $$B_x(x) = \mu_0 j_z(x) \quad (1)$$

To generate a pure quadrupole field, $j_z(x)$ is constant for all values of x. Applying Ampere's theorem $$B_y(x) = (\mu_0/d) j(x) x \quad (2)$$

Where d is the distance from each bar to the center line, 710.

Thus, for uniform currents flowing in the manner shown by the arrows in FIG. 7 a north pole generated at the end of one bar sees a south pole immediately opposite on the adjacent steel bar with the magnetic field $B_y(x)$ being zero at the center of the x-dimension, measured between the vertical steel connecting bars, 721, 722, and increasing linearly from the center to each end changing sign at the center.

Those skilled in the art will recognize, because of superposition, that within the resolution limit of the geometry and assuming no saturation of the steel, whatever multipole is required can be excited by choosing the appropriate distribution of the current density, j(x). Clearly, individual windings having constant current and variable pitch can provide the needed variations in j(x) as has been disclosed in U.S. Pat. No. 3,541,328. However, it is realized that whatever multipole is needed can be excited by using a single group of windings provided the single winding layer is divided into a large number of short individually excited coils, 330 and 340, as illustrated in FIG. 3.

Some Specific Geometries

Figure 8:
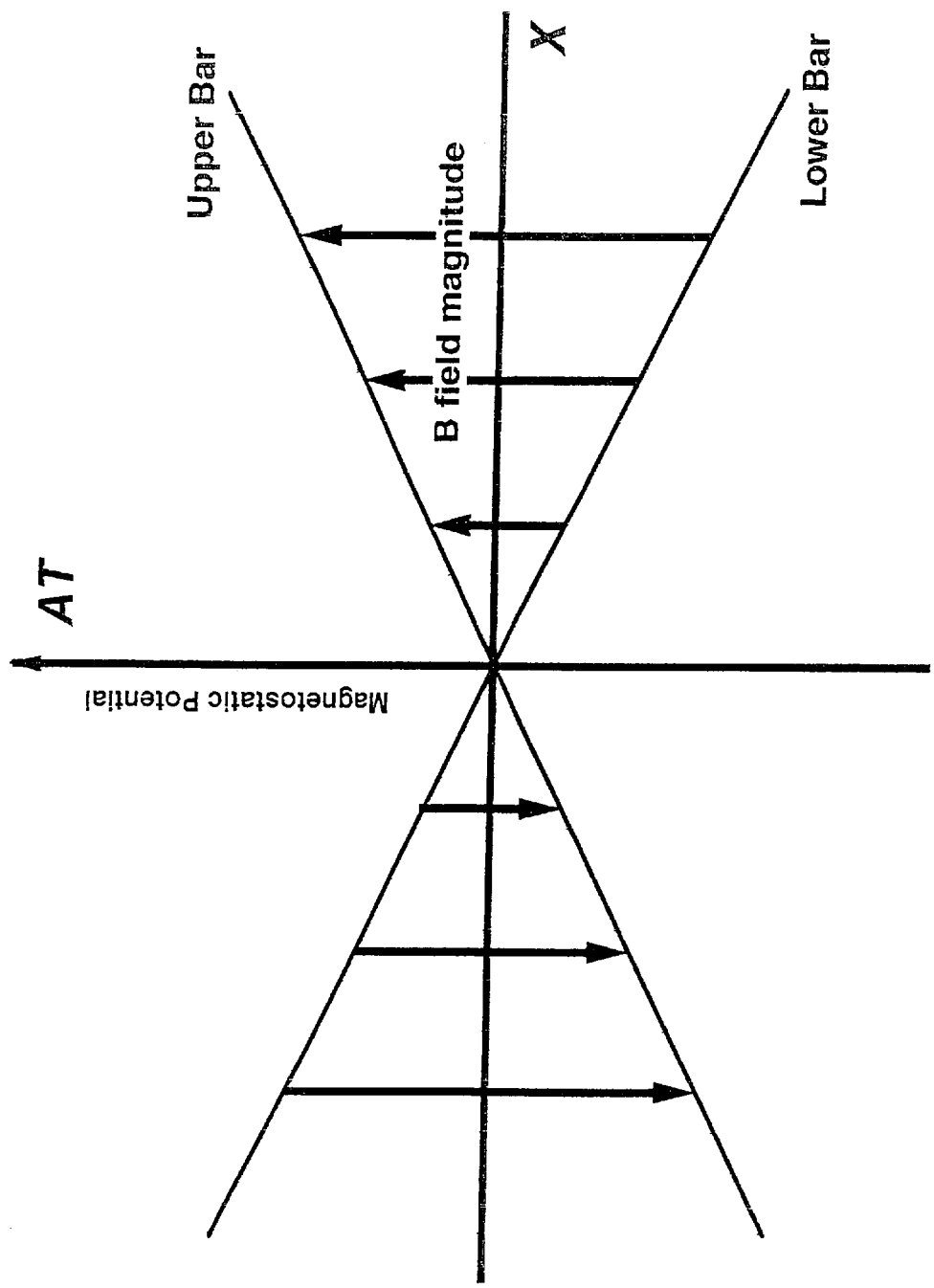
FIG. 8 illustrates the magnetostatic potentials that are needed to generate a quadrupole magnetic field in an embodiment of the present invention.

FIG. 8 is a graphical representation for understanding the generation of multipole fields that can be introduced by a lens corrector according to the embodiment of the present invention. Because excitation currents are d.c., or do not change rapidly with time, it is unnecessary to include vector potentials in the field description. Such a simplification allows the use of magnetostatic potentials, alone, for calculating the magnetic B-fields (the magnetic induction). The usefulness of this approach is that under these conditions the same equations are satisfied for magnetostatic fields as are satisfied for electrostatic fields with the driving potential for magnetostatic fields being ampere-turns rather than volts. However, it should be emphasized that such an analysis must not include the regions of current excitation which surrounds individual steel bars. Referring to equation (2) it can be seen that for quadrupole generation the difference between the magnetic potentials generated along each bar increases linearly from one end of the lens to the distant end. Thus, assuming uniformly spaced windings and equal currents through each winding, the loci of the associated magnetostatic equipotentials along each bar are straight lines that pass through zero at the center of each bar, because of symmetry. The $B_y(x)$ fields, which are produced between the bars, 314 and 316, described in FIG. 3, are excited by the negative gradient of the magnetostatic potential difference. As the distance between the high permeability steel tabs, 420 and 422, described in FIG. 4, is constant along the width of the lens/corrector, the difference between the magnetostatic potentials of each bar allows $B_y(x)$ to be calculated directly.

Figure 9A:
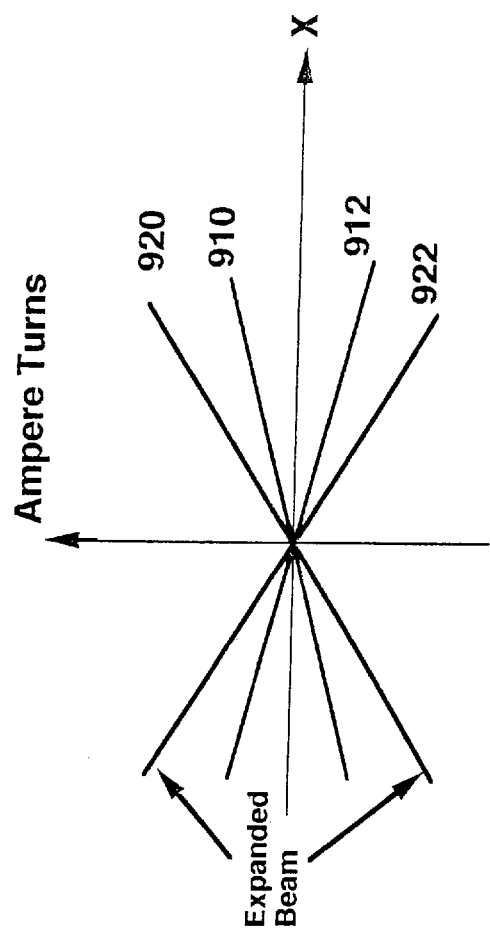
FIG. 9a illustrates changes in magnetostatic potential with resultant changes of beam width of a ribbon beam for an embodiment of the present invention.
Figure 9B:
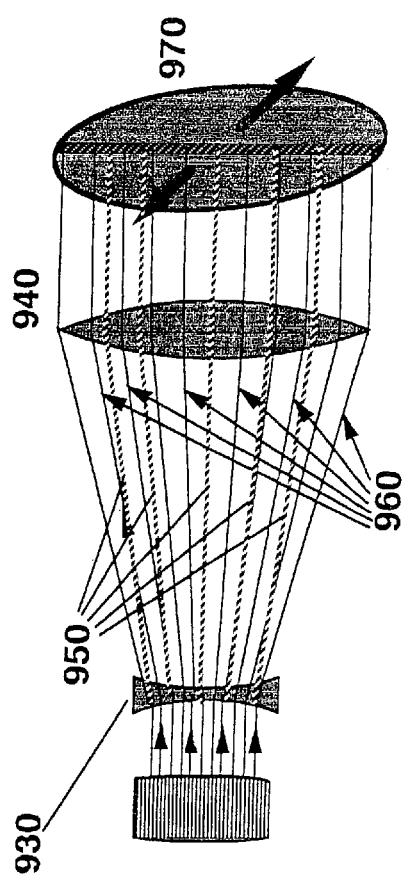
FIG. 9b illustrates ribbon beam expansion/contraction in connection with the magnetostatic potential distribution shown in FIG. 9a in connection with an embodiment of the present invention.

Using this same presentation, FIGS. 9a and 9b show schematically the manner in which expansion (or contraction) of a ribbon beam ensemble can be accomplished. In FIG. 9a the magnetostatic equipotentials, 910 and 912, associated with a diverging lens, 930, in FIG. 9b produce a reduced-size ribbon beam, 950, starting from a fully expanded beam, 960, produced by equipotentials, 920 and 922. A simple linear change of all of the currents through all of the elementary coils, 330 and 340, allows expansion of the width of the ribbon beam to appropriate size before the ribbon beam impacts the wafer, 970.

Figure 10A:
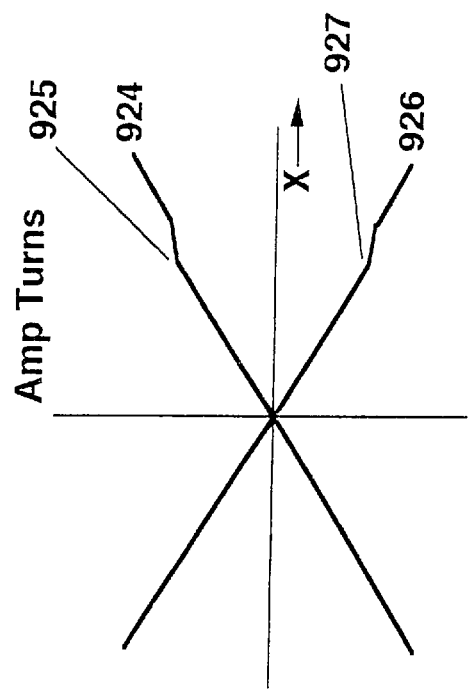
FIG. 10a illustrates magnetostatic potential correction associated with a change in the local ribbon density in connection with an embodiment of the present invention.
Figure 10B:
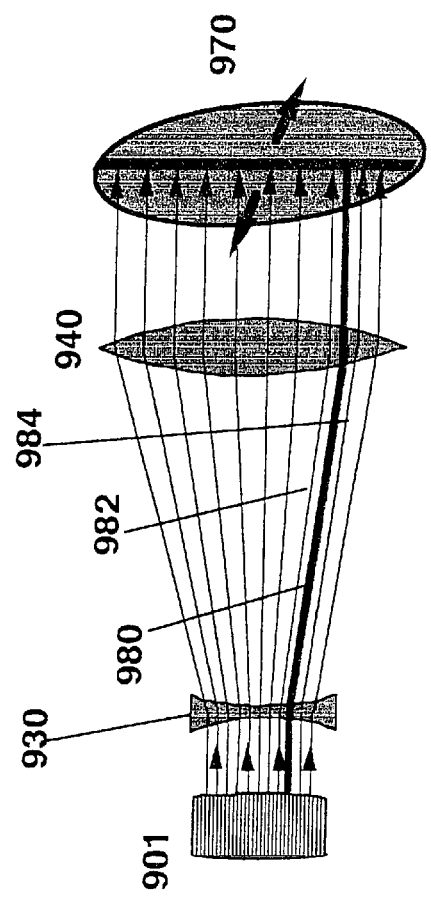
FIG. 10b illustrates a local ribbon beam intensity correction in connection with steering about the y-axis in connection with an embodiment of the present invention.

In FIGS. 10a and 10b, an individual beamlet, 980, is assumed to leave an ion source, 901, with intensity lower than anticipated for the remainder of the beamlets. To compensate for the reduced local ion density in the ribbon beam the fan-out pattern produced by the diverging lens, 930, is locally compressed around the attenuated beamlet, 980, by reducing the angular spacing between trajectories, 982, and 984. When satisfactory uniformity has been achieved at the entrance to lens 940, the overall spread of the fan is modified, as shown in FIGS. 9a and 9b, to allow uniform implantation of the whole work piece. It can be seen from the magnetostatic potential plot that for both bars forming the diverging lens, 930, the magnetostatic potentials, 924 and 926, no longer increase linearly from the center of each bar but rather have been reduced locally, at 925 and 927, to introduce a non-linearity in deflection angles for trajectories 984 and beyond that restores uniformity of implant intensity along the width of the ribbon beam. If necessary, angle corrections to compensate for this non-linear deflection can be introduced in lens, 940.

There is a one-to-one correspondence between position along the final ribbon beam and the coil location along the first quadrupole bar allowing the computer correction algorithm to be simple and straight forward.

Figure 11A:
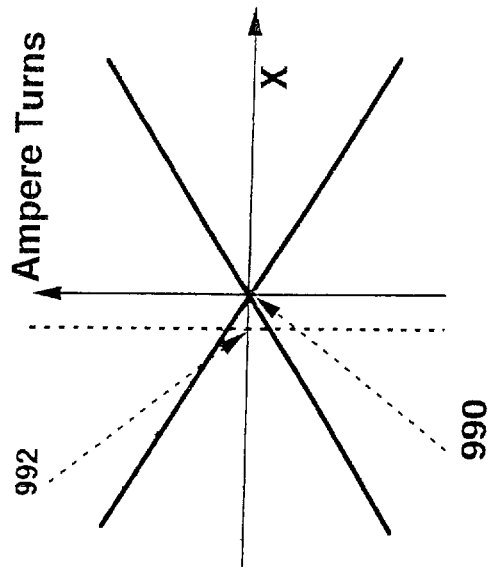
FIG. 11a illustrates magnetostatic potential for introducing y-steering of a ribbon beam in connection with an embodiment of the present invention.
Figure 11B:
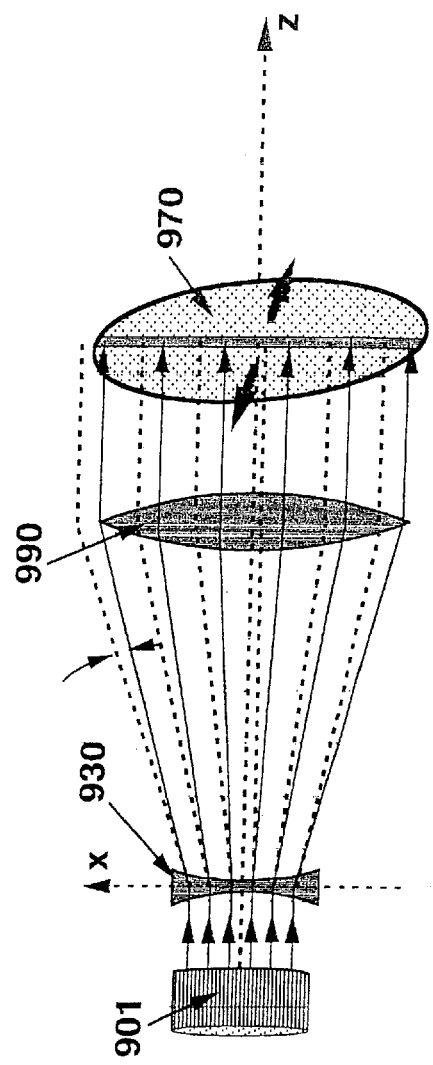
FIG. 11b illustrates a beam motion in the x direction at the wafer steering or steering about the y-axis of a ribbon beam in connection with an embodiment of the present invention.

FIGS. 11a and 11b show a method for introducing ribbon beam shifts along the x-direction or a rotation around the y-axis normal to the X-Z plane of FIG. 11b. Basically, to introduce a parallel shift all of the individual coils along both bars of the lens/corrector, 930, are electrically energized to produce a zero, 990, that is offset from the nominal center of the lens, 930. A compensating correction needed for the lens 990. To produce rotation about the y-axis the collimating currents through the lens 940, are adjusted appropriately to not return the output trajectories to being parallel to the ions leaving the source, 901.

Figure 12:
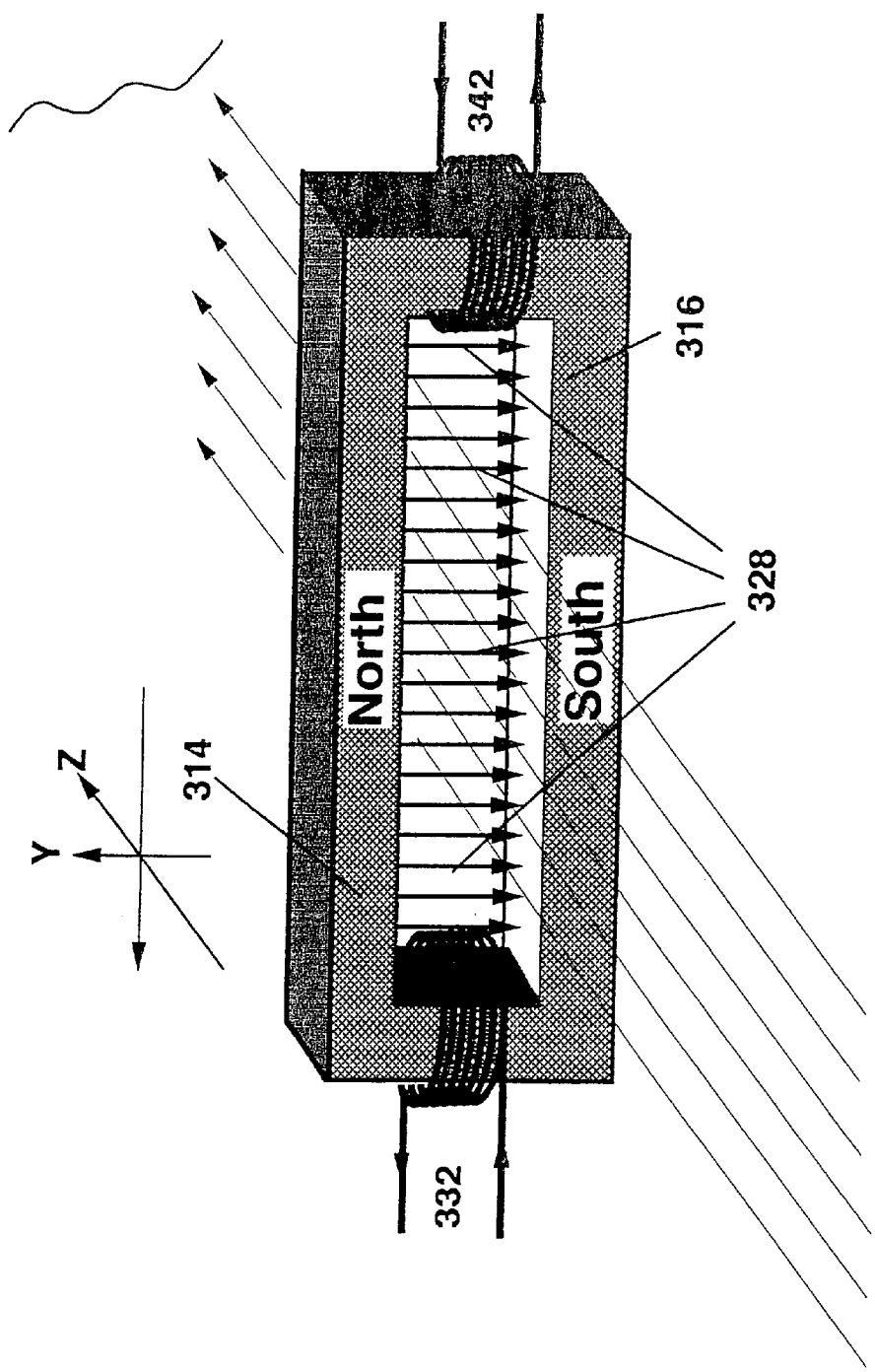
FIG. 12 illustrates the mode of steering of a ribbon beam about the y-axis in connection with an embodiment of the present invention.

The principles used for producing the above offset in an alternate embodiment of the present invention are illustrated in FIG. 12. The coils, 330 and 340, illustrated in FIG. 3 and distributed along the bars, 314, and 316, are not energized and are left from the drawing to minimize confusion. The bucking coils, 332, 342, produce a uniform strip of magnetic $B_y$-field, 328, that in the median plane is wholly parallel to the direction of the y-axis. Thus, there is no $B_x$-field component along the x-direction so that it is not possible to induce motion out of the X-Z plane. Steering about the Y direction is fully decoupled from lens action and steering about the X-direction.

Figure 13A:
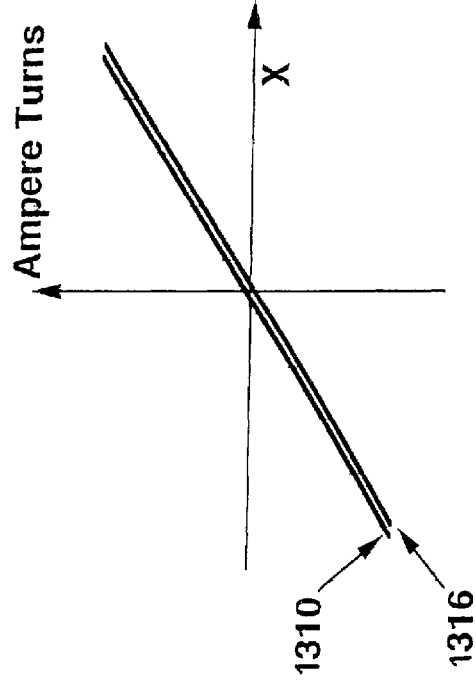
FIG. 13a illustrates magnetostatic distribution along both bars in connection with a mode that allows deflection about the x-axis in connection with an embodiment of the present invention.
Figure 13B:
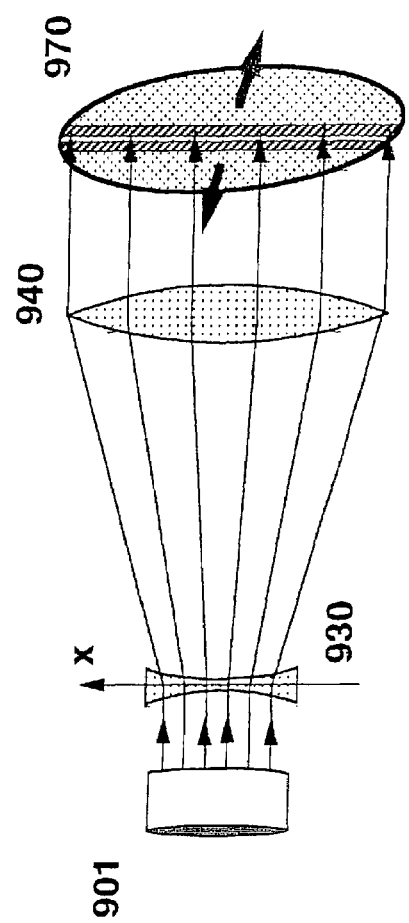
FIG. 13b illustrates steering about the x-axis of a ribbon beam in connection with an embodiment of the present invention.

FIGS. 13a and 13b, show a method for generating uniform B-fields along the x-direction. In FIG. 13a a pair of magnetostatic potentials, 1310 and 1316 are generated each having equal magnitude and direction along the individual bars with respect to one end. This can be achieved by energizing the coil collection, 330 and 340, shown in FIG. 3, uniformly and with the same hand. While the contribution to the magnetostatic potential from both bars would ideally be equal, it is possible for them to be unequal, as is shown in FIG. 13a.

In practice, without exceptions, superposition allows all of these previously described field arrangements to be added together to produce a combination deflection structure that produces focusing, corrections of aberrations, corrections for differential variations in source output, and local steering across the ribbon ion beam around both X and Y axes. The constraint is that saturation should be minimal in the ferromagnetic members.

A useful lens/corrector geometry.

Figure 14:
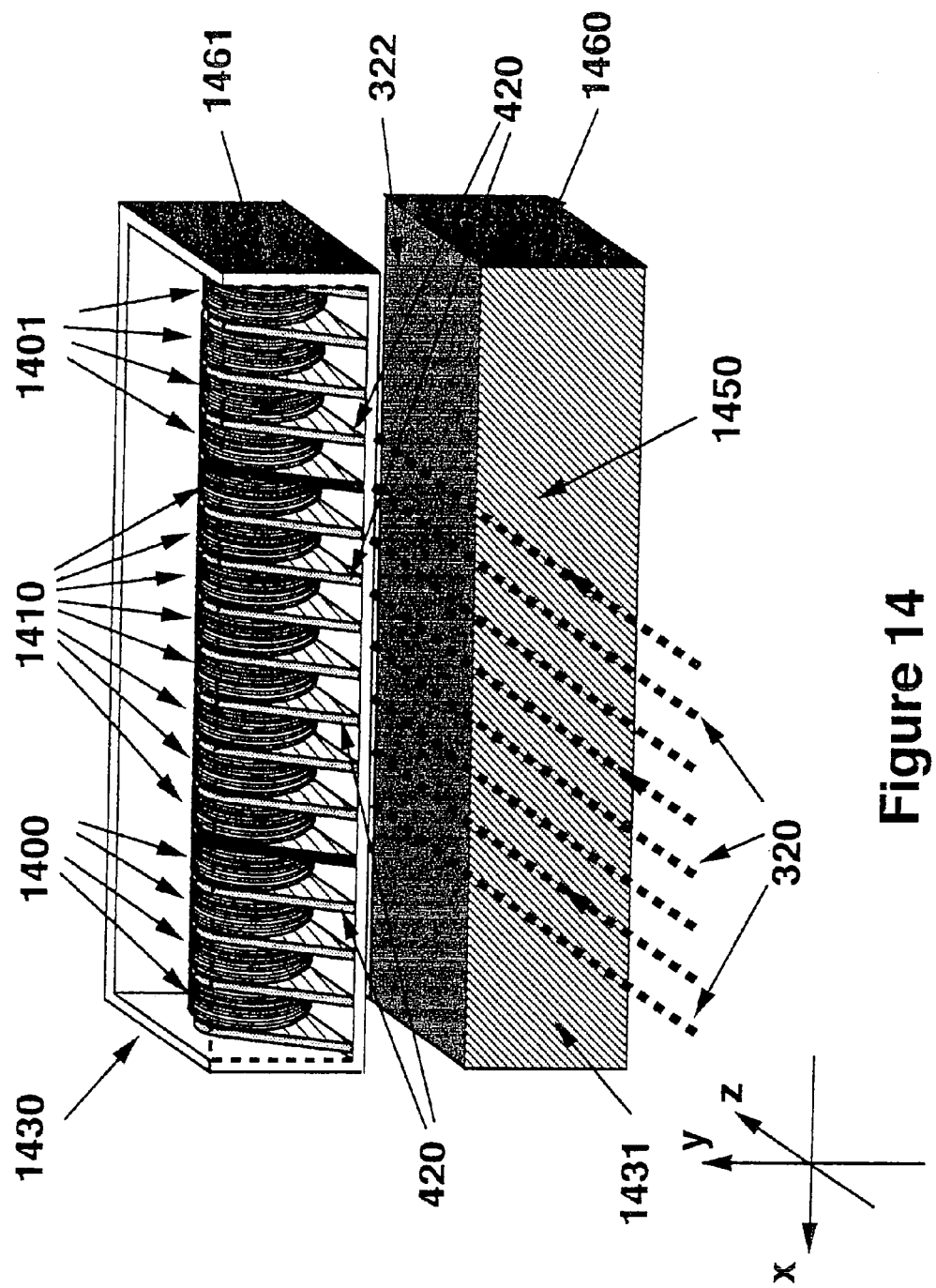
FIG. 14 illustrates a topologically equivalent geometry for a lens/steerer corrector element in connection with an embodiment of the present invention.

FIG. 14 illustrates the design of a lens/corrector assembly consisting of two independent elements, 1430 and 1431, between which a ribbon beam can be directed through the slot, 322. Such a lens/corrector assembly, which is topologically identical to the rectangular steel bar structure illustrated in FIG. 3, has useful characteristics for insertion into the vacuum region of a beam-transport pipe and into the fringe field regions of a magnetic deflector where the vertical steel parts of the rectangular bar structure, 310, in FIG. 3, would short circuit the poles producing the magnetic deflection field.

In principle, the vertical bars, 312, illustrated in FIG. 3, together with their associated windings, 332 and 334, have been severed at the central symmetry-point of each of the bucking windings. Referring again to FIG. 14, the bucking windings associated with the cut-away upper bar are labeled 1400,1401. The windings that produce the focusing field are labeled 1410. After severance it should be arranged that the same current continues to pass through the resulting 'half-windings', 1400, 1401, so that when a lens/corrector is used in lens mode each resultant half winding will produce half the ampere turns as the original windings 332 and 334, illustrated in FIG. 3. Each element has three independently wound excitation coils that, if necessary, can themselves be wound as a collection of independent coils, 330, such as those shown in FIG. 3, to allow the introduction of multipole correction fields. Just as in the structure presented in FIG. 3 where the ampere-turns around the whole bar structure must integrate to zero, the symmetry of the independent element array, 1430 and 1431, requires that along the length of each element the total magnetostatic potential must integrate to zero.

FIG. 14 illustrates the cross section of a quadrupole designed according to the above prescription. A ferromagnetic bar is located at the center of each element. This bar need not have a cylindrical cross section, but those skilled in the art will recognize that the cross-sectional area must be adequate to avoid saturation. Three independent winding sections, 1400, 1401 and 1410, are wrapped around each bar. To allow multipole generation and aberration correction the individual winding sections can themselves consist of a group of individually excited coils as was illustrated in FIG. 3, item 330. Ferromagnetic extension tabs, 420, introduced in the manner shown in FIG. 4, transfer the magnetostatic potential, generated along the length of the central steel bar, close to the boundary of the ribbon ion beam. The effect is to minimize the volume of magnetic field that must be produced and the needed ampere turns. Also, to improve the spatial resolution of the lens/corrector fields at an ion beam boundary in the lens aperture.

Without reservations the bars and associated coil structures are enclosed within closed tubes, 1430, 1435, manufactured from a suitable non-magnetic material having rectangular cross section. This enclosing tube structure permits the outside walls of the tube to be in vacuum while power leads to the coils and air or water cooling is readily accessible through the ends, 1460 and 1461.

A useful feature of the lens/corrector presented in FIG. 14 is while the total magnetostatic potential generated along each element must integrate to zero, it is not essential to pass equal currents through the windings within the elements 1430 and 1431. An unbalance in current ratio between the two elements changes the position of the neutral axis of the lens causing it to move in the Y-direction an introduce steering of an ion beam about the X-axis.

Figure 15:
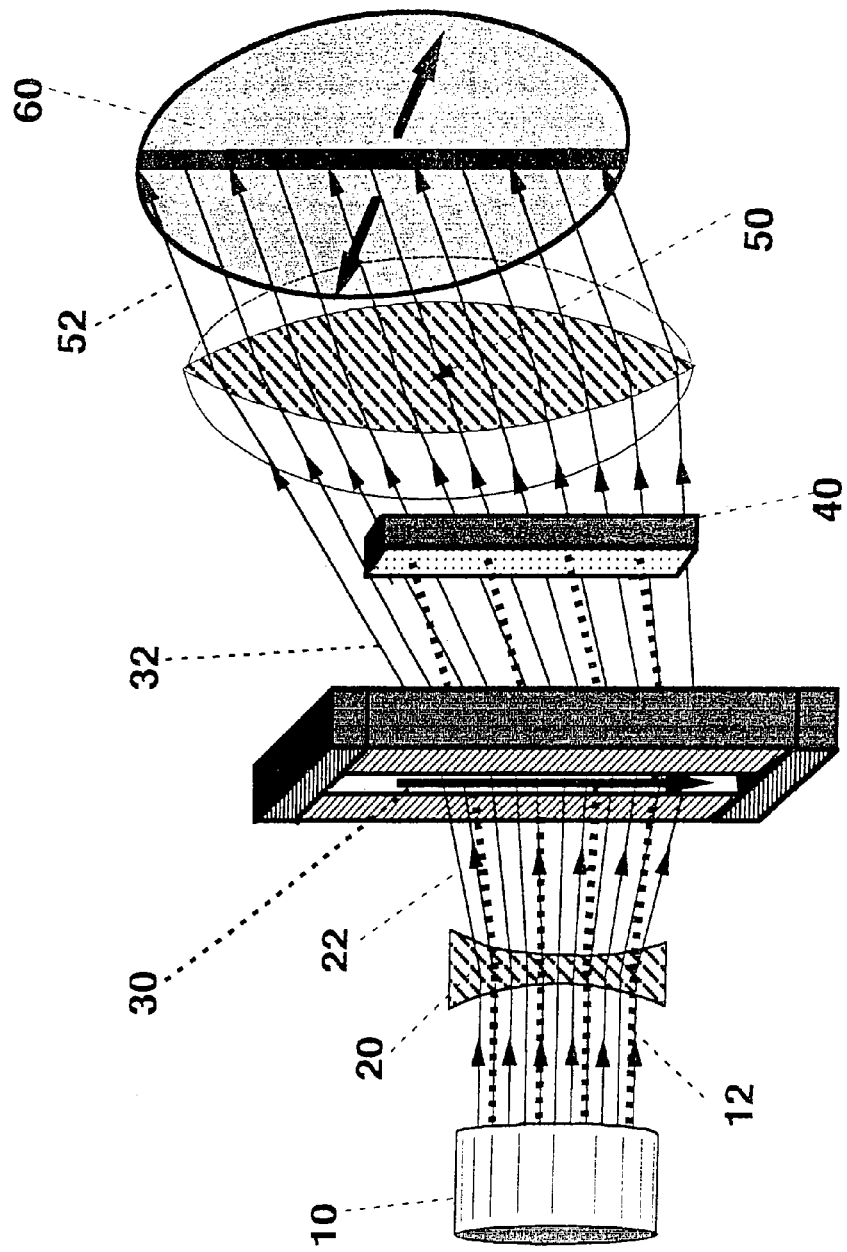
FIG. 15 illustrates principles of a hydrogen ion implanter designed in connection with an embodiment of the present invention.

Hydrogen Implanter:

FIG. 15, a further embodiment of the present invention, shows the principles of a high current $H^+$ implanter for implanting ions into large-diameter semiconductor wafers using the ion transport elements described earlier. A suitable ion source, 10, produces a ribbon array of beamlets, 12, with all beamlets having the same energy, between 10 keV and 100 keV. A multipole corrected diverging lens, 20, introduces diverging angles into the array, 22, of beamlets to produce the necessary ribbon width. A momentum-dispersing magnetic field, 30, with its B-field vector in the plane of the diverging beamlets and approximately at right angles to the central beamlet of the array, deflects the ions at right angles to the plane of said ribbon beam allowing ions heavier than H$^+$ to be collected into a cup, 40; this arrangement eliminates deuterium and other molecular contributions. A second multipole-corrected lens, 50, collimates the array of the diverging beamlets and returns the beamlets to parallelism. A platen supports a wafer, 60, and uniformly scans it, across the beam. This novel yet simple system employs no electromagnetic beam scanning. The advantages are short length, low cost, a simple optical path and small footprint.

Figure 16:
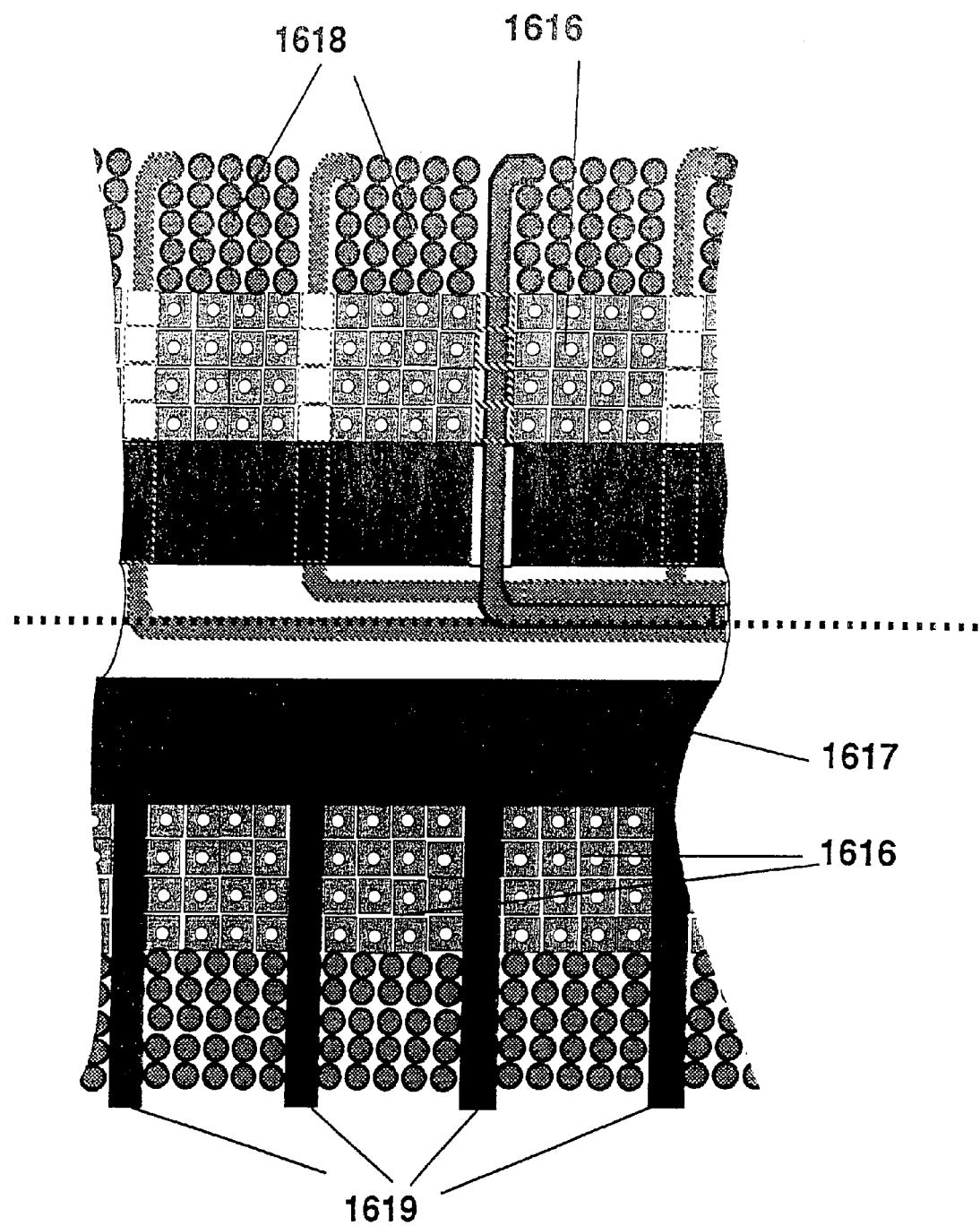
FIG. 16 illustrates a cross section of a composite bar in connection with an embodiment of the present invention.

FIG. 16 shows the manner in which multiple-use coils can be mounted along a short section of one of the high permeability bars, 1617, to provide the high magnitude ampere-turns that are needed for exciting some deflection modes. It can be seen that continuous high-current capacity water-cooled coils, 1616, are wrapped as an under layer directly around a cylindrical magnetic core, 1617. Individually excitable coils, 1618, as shown in FIG. 3 as items 330 and 340, also surround the high permeability steel bar, 1615, to provide focusing and aberration corrections. Individual steel tabs 420, transfer the magnetostatic potentials to the region near to the beam.

Any additional changes in the details, materials, and arrangement of parts, herein described and illustrated, can be made by those skilled in the art. Accordingly, it will be understood that the following claims are not to be limited to the embodiment disclosed here, and can include practices otherwise than those described, and are to be interpreted as broadly as allowed under the law.

The invention claimed is:

1. A process for manufacturing a semiconductor device, comprising:
   a. creating an ion beam comprising ions to be implanted in said device;
   b. focusing said ion beam by passing said ion beam between an upper magnetic core member and a lower magnetic core member spaced apart from said upper core member, said lower core member being oriented with its axis substantially parallel to the axis of said upper core member, wherein a plurality of focusing coil units are distributed along said upper core member and corresponding focusing coil units are distributed along said lower core member, each said focusing coil unit comprising a single continuous electrical circuit that surrounds an individual core member;
   c. exciting said focusing coil units distributed along said upper core member and said corresponding focusing coil units distributed along said lower core member such that the direction of the current in each of said excited focusing coil units distributed along said upper core member is the opposite of the direction of the current in said corresponding focusing coil units distributed along said lower core member when viewed from one end of the upper and lower core members; and
   d. directing said focused beam onto said device.

2. The process of claim 1, further comprising end coil units located on said upper core member between said plurality of focusing coil units and each end of said upper core member, and end coil units located on said lower core member between said plurality of corresponding focusing coil units and each end of said lower core member.

3. The process of claim 2, further comprising exciting said end coil units located on said upper core member in the opposite direction from the current in said end coil units located on said lower core member.

4. The process of claim 1, wherein the current in each of said focusing coil units distributed along said upper core member is in the same direction.

5. A process for manufacturing a semiconductor device, comprising:
   a. creating an ion beam comprising ions to be implanted in said device;
   b. focusing said ion beam by passing said ion beam between an upper magnetic core member, a lower magnetic core member spaced apart from said upper core member, said lower core member being oriented with its axis substantially parallel to the axis of said upper core member and its ends substantially aligned with the ends of said upper core member, and additional members connecting said ends of said magnetic core members so as to form a rectangular frame; where a plurality of independent current excited coil units are distributed along said upper core member and corresponding coil units are distributed along said lower core member, each said coil unit comprising a single continuous electrical circuit that surrounds an individual core member;
   c. exciting said coil units distributed along said upper core member and said corresponding coil units distributed along said lower core member such that the direction of the current in each of said excited coil units distributed along said upper core member is the opposite of the direction of the current in said corresponding coil units distributed along said lower core member when viewed from one end of the upper and lower core members; and
   d. directing said focused beam onto said device.

6. The process of claim 5, further comprising at least one coil unit distributed on each of said additional members.

7. The process of claim 6, further comprising exciting said at least one coil unit on one of said additional members in one direction and said at least one coil unit on the opposite additional member in an opposite direction.

8. A process for manufacturing a semiconductor device, comprising:
   a. creating an ion beam comprising ions to be implanted in said device;
   b. focusing said ion beam by passing said ion beam between an upper magnetic core member and a lower magnetic core member spaced apart from said upper core member, said lower core member being oriented with its axis substantially parallel to the axis of said upper core member, wherein a plurality of focusing coil units are distributed along said upper core member and corresponding focusing coil units are distributed along said lower core member, each said focusing coil unit comprising a single continuous electrical circuit that surrounds an individual core member;
   c. exciting one of said focusing coil units distributed along said upper core member and its corresponding focusing coil unit distributed along said lower core member such that the direction of the current in said one excited focusing coil unit distributed along said upper core member is the opposite of the direction of the current in said corresponding focusing coil unit distributed along said lower core member when viewed from one end of the upper and lower core members; and
   d. directing said focused beam onto said device.

9. The process of claim 8, further comprising end coil units located on said upper core member between said plurality of focusing coil units and each end of said upper core member, and end coil units located on said lower core member between said plurality of corresponding focusing coil units and each end of said lower core member.

10. The process of claim 9, further comprising exciting said end coil units located on said upper core member in the opposite direction from the current in said end coil units located on said lower core member.

11. The process of claim 8, wherein the current in each of said focusing coil units distributed along said upper core member is in the same direction.

\* \* \* \* \*

UNITED STATES PATENT AND TRADEMARK OFFICE
CERTIFICATE OF CORRECTION

PATENT NO. : 7,351,984 B2
APPLICATION NO. : 11/784073
DATED : April 1, 2008
INVENTOR(S) : Kenneth H. Purser et al.

It is certified that error appears in the above-identified patent and that said Letters Patent is hereby corrected as shown below:

On the title page, delete item:

"(73) Assignee: Varian Semiconductor Equipment Associates, Inc., Gloucester, MA (US)"

Signed and Sealed this

Eighth Day of December, 2009

David J. Kappos
*Director of the United States Patent and Trademark Office*